(12) United States Patent
Kroger et al.

(10) Patent No.: US 11,716,821 B1
(45) Date of Patent: Aug. 1, 2023

(54) COMPACT STACKABLE TRAYS WITH POSITIONING RACKS

(71) Applicant: The United States of America as represented by the Secretary of the Navy, Newport, RI (US)

(72) Inventors: Michael J Kroger, Middletown, RI (US); Brian K Amaral, Newport, RI (US); Alia W Kroger, Middletown, RI (US); Robert F Cutler, III, Tiverton, RI (US); Kimberly M Cipolla, Portsmouth, RI (US)

(73) Assignee: The United States of America as represented by the Secretary of the Navy

( * ) Notice: Subject to any disclaimer, the term of this patent is extended or adjusted under 35 U.S.C. 154(b) by 8 days.

(21) Appl. No.: 17/381,229

(22) Filed: Jul. 21, 2021

(51) Int. Cl.
*H02G 3/32* (2006.01)
*H05K 5/02* (2006.01)
*H02G 3/04* (2006.01)
*H02G 3/00* (2006.01)
*H02G 3/38* (2006.01)

(52) U.S. Cl.
CPC ......... *H05K 5/0204* (2013.01); *H02G 3/0456* (2013.01); *H02G 3/263* (2013.01); *H02G 3/32* (2013.01); *H02G 3/383* (2013.01); *H05K 5/023* (2013.01); *H05K 5/0226* (2013.01); *H05K 5/0247* (2013.01)

(58) Field of Classification Search
None
See application file for complete search history.

(56) References Cited

U.S. PATENT DOCUMENTS

| 5,516,034 | A  | * | 5/1996  | Jensen ................. B65D 5/4295 229/120.38 |
|-----------|----|---|---------|------------------------------------------------|
| 5,992,802 | A  |   | 11/1999 | Campbell                                       |
| 6,356,697 | B1 |   | 3/2002  | Braga et al.                                   |
| 7,200,314 | B2 |   | 4/2007  | Womack et al.                                  |
| 7,916,502 | B2 |   | 3/2011  | Papakos et al.                                 |
| 7,922,012 | B2 |   | 4/2011  | Sisley                                         |
| 8,193,448 | B2 |   | 6/2012  | Syed                                           |
| 8,294,030 | B2 |   | 10/2012 | Pollard, Jr.                                   |
| 8,328,026 | B2 |   | 12/2012 | Boduch et al.                                  |
| 8,540,436 | B2 |   | 9/2013  | Clasessens et al.                              |
| 8,558,112 | B2 |   | 10/2013 | Pawluk                                         |
| 8,605,459 | B2 |   | 12/2013 | Papakos et al.                                 |

(Continued)

*Primary Examiner* — Steven M Marsh
(74) *Attorney, Agent, or Firm* — James M. Kasischke; Michael P. Stanley

(57) ABSTRACT

A cable tray and method of use is provided with the cable tray having a bottom extending along a horizontal panel with two opposite side edges. A pair of side walls attaches to the two opposite side edges. A first positioning rack extends between the side walls. The first positioning rack is orthogonal to the tray bottom and the side walls. A second positioning rack extends between the side walls. The second positioning rack is orthogonal to the tray bottom and the side walls. A first foot bar affixes to an underside of the tray bottom. The first foot bar is vertically aligns with the first positioning rack. A second foot bar affixes to the underside of the tray bottom. The second foot bar vertically aligns with the second positioning rack. Each of the first positioning rack and second positioning rack includes cable support apertures.

14 Claims, 7 Drawing Sheets

(56) References Cited

U.S. PATENT DOCUMENTS

| | | |
|---|---|---|
| 8,655,136 B2 | 2/2014 | Trebesch et al. |
| 8,953,921 B2 | 2/2015 | Smrha et al. |
| 9,059,575 B2 | 6/2015 | Pawluk |
| 9,583,922 B2 * | 2/2017 | Pawluk .................... H02B 7/08 |
| 2009/0260846 A1 * | 10/2009 | Henry .................. H02G 3/0406 |
| | | 174/101 |
| 2014/0008123 A1 * | 1/2014 | Pawluk ................ H02G 3/0437 |
| | | 174/99 R |
| 2015/0255967 A1 * | 9/2015 | Pawluk .................... H02B 1/20 |
| | | 174/38 |
| 2016/0238811 A1 * | 8/2016 | Simmons ............. G02B 6/4452 |

\* cited by examiner

COMPACT STACKABLE TRAYS WITH POSITIONING RACKS

STATEMENT OF GOVERNMENT INTEREST

The invention described herein was made in the performance of official duties by employees of the U.S. Department of the Navy and may be manufactured, used, or licensed by or for the Government of the United States for any governmental purpose without payment of any royalties thereon.

CROSS REFERENCE TO OTHER PATENT APPLICATIONS

None.

BACKGROUND OF THE INVENTION

1) Field of the Invention

The present invention relates to cable trays and specifically to cable trays with positioning racks that allow the stacking of the cable trays.

2) Description of the Prior Art

A towed array can be several miles in length and can contain a network of delicate telemetry and sensor components. Construction of a towed array electrical harness requires multiple long benches to map, construct and test the components of the array.

This construction process has phases that may span several months and requires a significant amount of labor. As a result, sensitive and fragile array components remain exposed on open benches. This exposure creates the potential for damage which then leads to a great deal of cost and rework due to the significant length and delicate soldered connections in the electrical harness of the towed array.

SUMMARY OF THE INVENTION

In accordance with the present invention, a cable tray is provided which includes a tray bottom extending along a horizontal plane. The tray bottom has two opposite side edges and a pair of sidewalls vertically attached to the side edges to form the open cable tray.

A first positioning rack and a second positioning rack extend between the sidewalls. The positioning racks are orthogonal to the tray bottom and the sidewalls. A first foot bar is positioned on an underside of the tray bottom in which the foot bar vertically aligns with the first positioning rack. A second foot bar is on the underside of the tray bottom in which the foot bar vertically aligns with the second positioning rack. Each of the positioning racks includes cable support apertures and opening slots.

A method of storing a wiring harness is also provided. The method includes providing a tray with a bottom extending along a horizontal plane and having opposite side edges. The tray has a pair of side walls attached to the side edges. A first positioning rack and a second positioning rack extend between the side walls. Each of the positioning racks includes cable support apertures having upwardly opening slots. A wiring harness is laid along the tray bottom with the wires of the harness positioned in the upwardly opening slots. Each of the components is held in a cable support aperture.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
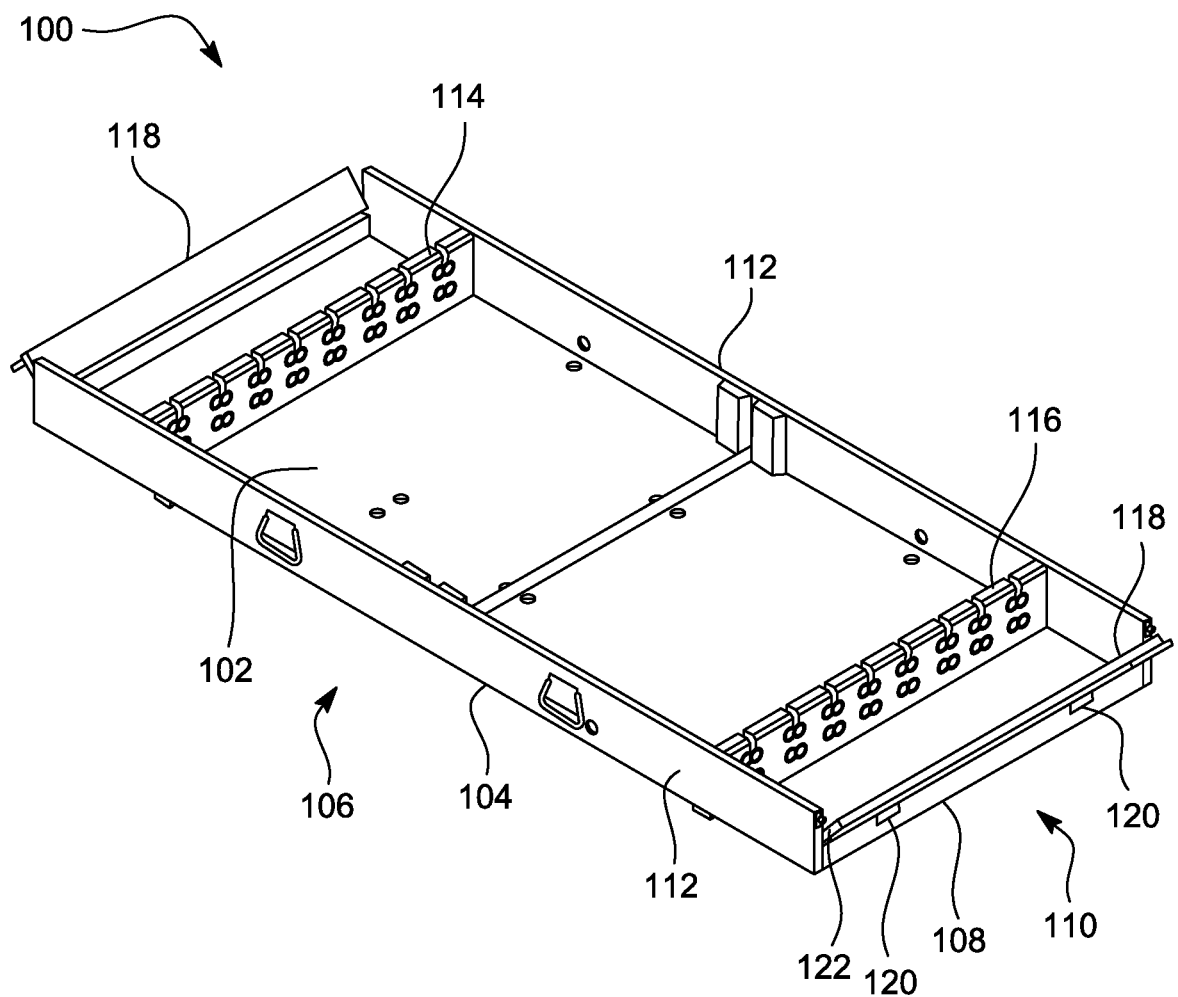
FIG. 1 depicts a stackable tray in accordance with the present invention.

FIG. 1 depicts a cable tray 100 with a tray bottom 102 extending along a horizontal panel. The tray bottom 102 has two opposite long side edges 104 along two opposing long sides 106 and two opposite short side edges 108 along two opposing short sides 110. A pair of side walls 112 attach to the tray bottom 102 at the long side edges 104. A first positioning rack 114 extends between the side walls 112. The first positioning rack 114 is orthogonal to the tray bottom 102 and the side walls 112.

A second positioning rack 116 extends between the side walls 112. The second positioning rack 116 is orthogonal to the tray bottom 102 and the side walls 112. Doors 118 are connected to the opposing short sides 110 at the short side edges 108. Hinges 120 allow the doors 118 to move between an open position that is outward from the tray bottom 102 and a closed position that is perpendicular to the tray bottom. Latches 122 hold the doors 118 in the closed position. The doors 118 may also be removable.

The cable tray 100 is approximately eighty-four inches long and approximately thirty-six inches wide. The first positioning rack 114 and second positioning rack 116 are positioned on the tray bottom 102 and displaced from the short edges 108. That is, the doors 118 may be approximately eighty-four inches apart with the first positioning rack 114 and second positioning rack 116 approximately fifty inches apart.

Figure 2:
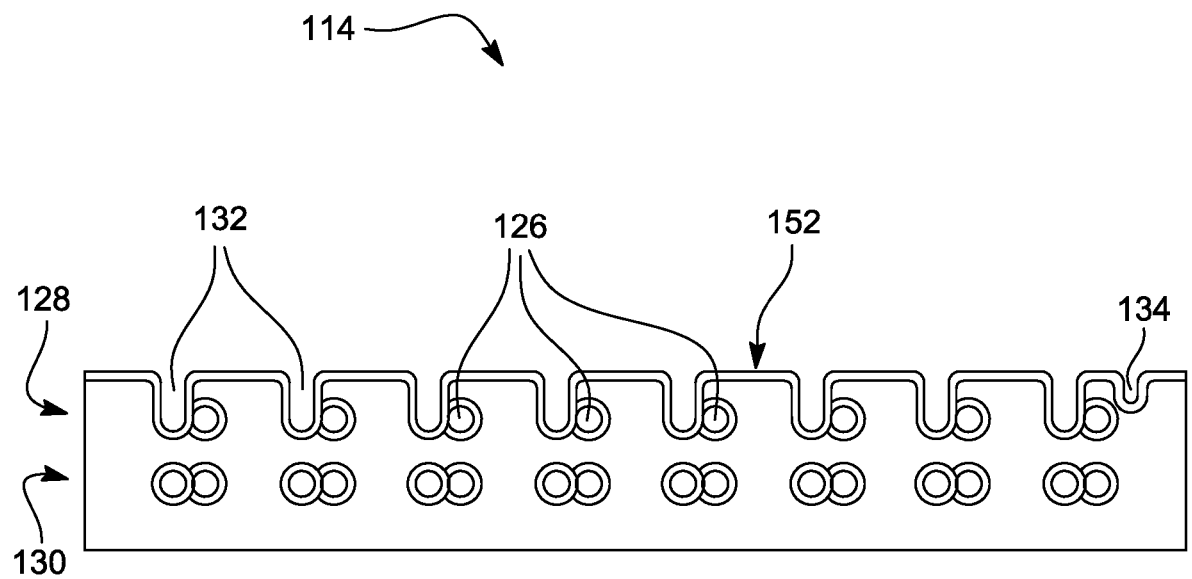
FIG. 2 depicts a positioning rack of the stackable tray in accordance with the present invention.

FIG. 2 depicts the first positioning rack 114. The first positioning rack 114 and the second positioning rack 116 are identical to each other so that only one positioning rack 114 is described herein. The positioning rack 114 includes cable support apertures 126. The support apertures 126 are arranged in a top row 128 and a bottom row 130. The apertures 126 are also arranged in pairs; however, other arrangements may be used. The apertures 126 are sized and configured to retain and organize components in their respective groupings.

The positioning rack 114 protects components and connectors in a wiring harness from unintended motion. In another embodiment, the apertures 126 include an upwardly opening slot 132 to allow for wires to pass through to set in the apertures. The positioning rack 114 may also include a wire channel 134.

Figure 3:
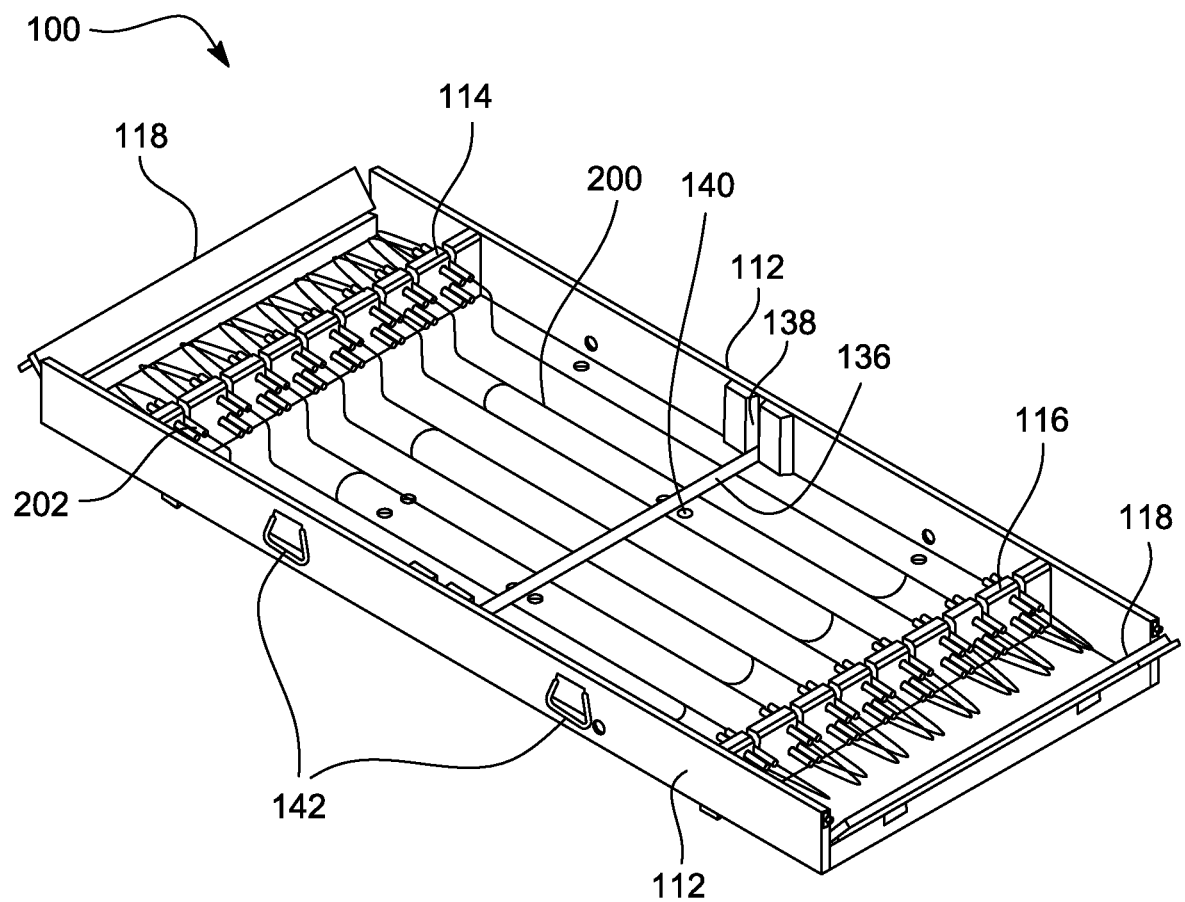
FIG. 3 depicts the stackable tray of FIG. 1 with a wire harness and connectors therein.

Referring to FIG. 3, the cable tray 100 is equipped with the positioning racks 114, 116 that organize wires 200 and components 202 to prevent the wires and components of a towed array system from becoming twisted, entangled, and/or damaged. The wires 200 are wound between and through the positioning racks 114, 116. The positioning racks 114, 116 organize and maintain the wires 200 in their intended configuration.

Returning to FIG. 3, the cable tray 100 has a center retaining piece 136 located between the positioning racks 114, 116. The retaining piece 136 prevents the wires 200 from shifting. The retaining piece 136 may include a dowel 154 that is approximately one inch in diameter to prevent pinching on the wires 200. See FIG. 6.

The retaining piece 136 is installed in guide tracks 138 to allow vertical movement and to prevent lengthwise movement of the retaining piece 136. The guide tracks 138 are mounted on an inner surface of the side walls 112. Apertures or holes 140 or other appropriate devices restrain the center retaining piece 136. In this manner, the electrical harness remains organized.

As further shown in FIG. 3, handles 142 are provided on the side walls 112 to ease lifting the cable tray 100. The handles 142 fold flat against the side walls 112. The doors 118 can be opened or removed for access when the cable trays 100 are stacked.

Figure 4:
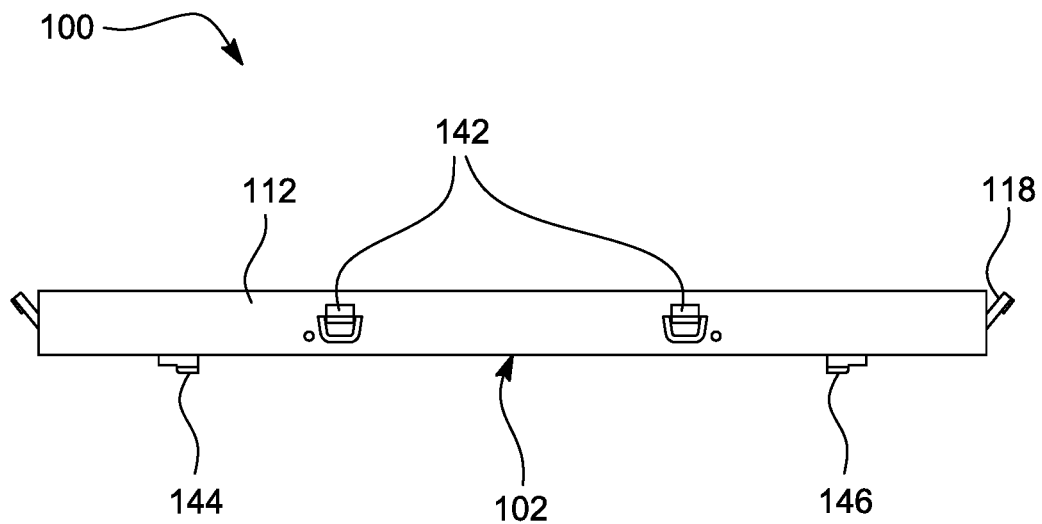
FIG. 4 depicts a side view of the stackable tray of FIG. 1.

As shown in FIG. 4, a first foot bar 144 is affixed to an underside of the tray bottom 102. The first foot bar 144 vertically aligns with the first positioning rack 114. A second foot bar 146 is affixed to the underside of the tray bottom 102. The second foot bar 146 vertically aligns with the second positioning rack 116. The foot bars 144, 146 act as structural components when the cable tray 100 is on a flat surface and act as spacing devices when the cable trays are stacked.

Figure 5:
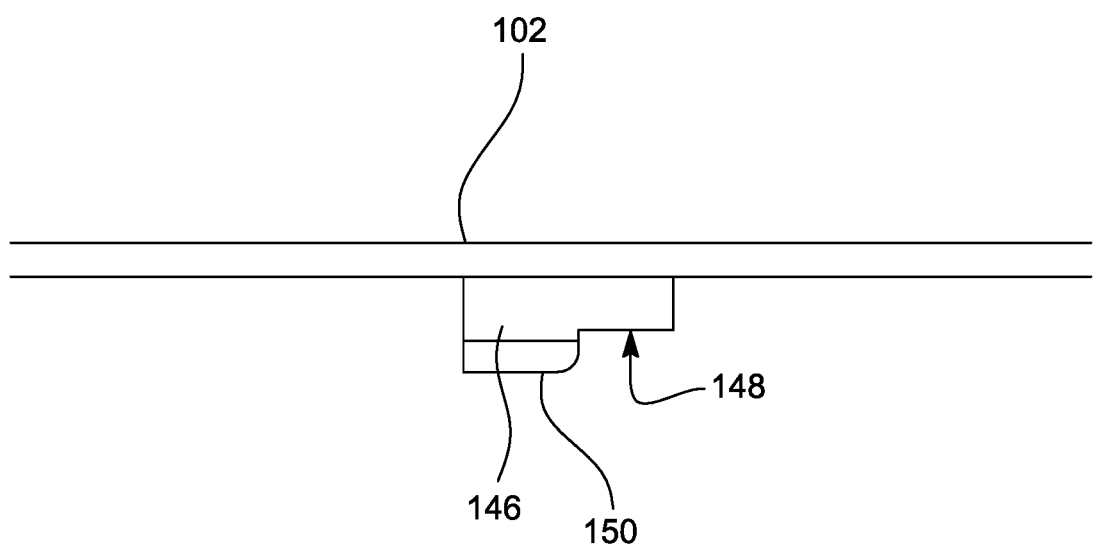
FIG. 5 depicts a detail portion of FIG. 4.
Figure 6:
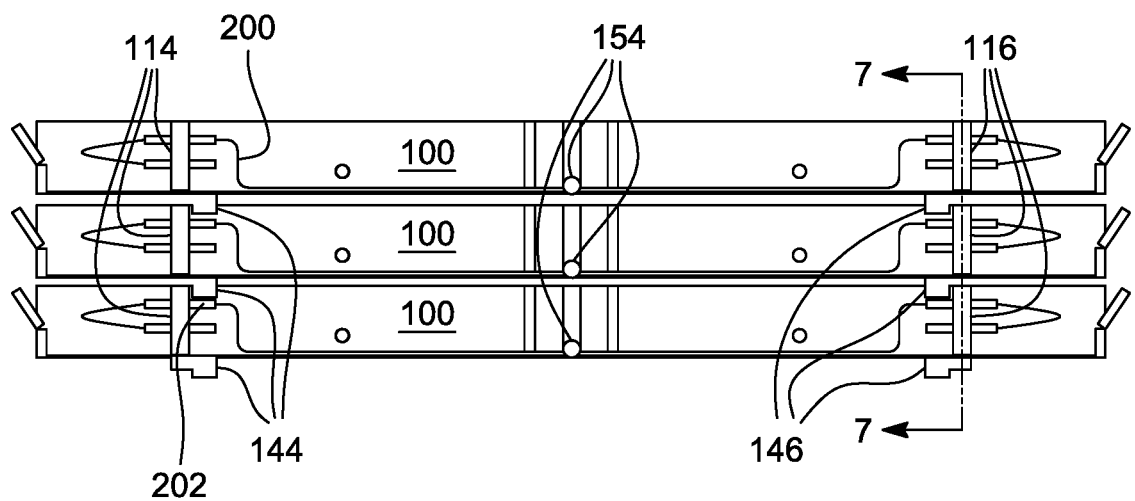
FIG. 6 depicts a side and section view of a stack of stackable trays.

As shown in FIG. 5, the foot bars (in an example foot bar 146) may be L-shaped when rotated on a side by having a seating surface 148 and an alignment protuberance 150. The foot bars 144, 146 are sized and configured so the seating surface 148 sets on a top surface of the positioning racks 114, 116, respectively, of a tray below. As shown in FIG. 6, this action directly transfers the load of the cable tray 100 to the foot bars 144, 146 of the tray below.

Figure 7:
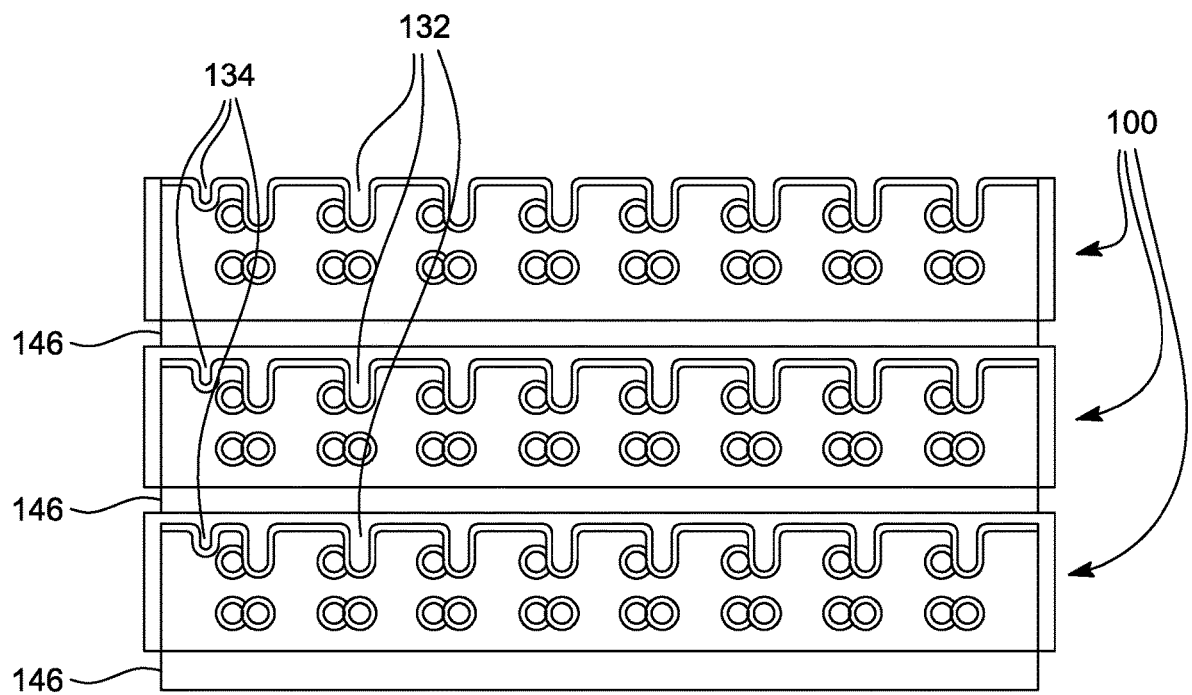
FIG. 7 depicts a front view and section cut of the stack of stackable trays of FIG. 6.

The shape of the foot bars 144, 146 can guide the cable tray 100 lengthwise on the positioning racks 114, 116, respectively, of a cable tray below. Furthermore, the foot bars 144, 146 may span across the underside of the tray bottom 102 to allow minimal widthwise shifting when the cable trays 100 are stacked. As shown in FIG. 7, the slots 132 and the wire channel 134 allow for wires to pass through and remain connected without being pinched when the cable trays 100 are stacked.

The handles 142 facilitate transport and can fold flat to minimize the overall width of the cable tray 100. Furthermore, the cable trays 100 protect the internal components and wires during handling, as part of the fabrication process, and during shipping. The cable trays 100 allow multiple harnesses to be simultaneously populated with components while occupying minimal space by being stackable.

In use, a cable tray 100 is provided. A wiring harness having a plurality of components 202 is laid along the tray bottom 102. The wires 200 are positioned in the upwardly opening slots 132. By using the cable trays 100, an entire array (for example, thirteen acoustic modules plus one forward interface module and one aft interface module) can be assembled. When the cable trays 100 are stacked, the hinged doors 118 provide access to array components and allow multiple wire harnesses to connect to one another.

The examples described herein are long, towed array systems for acoustic arrays; however, the cable trays described herein are equally applicable to other wiring systems including fiber optic cables, telecommunication lines, seismic arrays, and network sensors.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A cable tray comprising:
   a tray bottom extending along a horizontal plane and having a first pair of two opposite side edges and a second pair of two opposite side edges with doors hinged to said second pair of two opposite side edges;
   a pair of side walls attached to said first pair of two opposite side edges;
   a first positioning rack with a plurality of cable support apertures along a longitudinal face of said first positioning rack with said first positioning rack extending between said pair of side walls as well as orthogonal to said tray bottom and said pair of side walls;
   a second positioning rack with a plurality of cable support apertures along a longitudinal face of said second positioning rack with said second positioning rack extending between said pair of side walls as well as orthogonal to said tray bottom and said pair of side walls;
   a first foot bar affixed to an underside of said tray bottom, said first foot bar being vertically aligned with said first positioning rack; and
   a second foot bar affixed to the underside of said tray bottom, said second foot bar being vertically aligned with said second positioning rack.

2. The cable tray according to claim 1 wherein said doors are outwardly moveable from said tray bottom between an open position and a closed position.

3. The cable tray according to claim 1, wherein said doors are removable.

4. The cable tray according to claim 3, said cable tray further comprising a center retaining piece affixed between said first positioning rack and said second positioning rack.

5. The cable tray according to claim 4 said cable tray further comprising a guide track mounted on an inner surface of said pair of side walls with said center retaining piece vertically moveable in said guide track.

6. The cable tray according to claim 5, wherein said first foot bar and said second foot bar further comprise seating surfaces wherein said seating surfaces are sized and configured so that said seating surfaces land on a top surface of said positioning racks of another cable tray in a stacked configuration.

7. The cable tray according to claim 6, said cable tray further comprising handles mounted on an outer surface of said pair of side walls.

8. A tray, comprising:
   a tray bottom having two opposing long sides and two opposing short sides;
   side walls attached to said two opposing long sides of said tray bottom;
   doors attached to said two opposing short sides of said tray bottom;

a first positioning rack extending between said side walls adjacent a first end of said tray bottom;

a second positioning rack extending between said side walls adjacent a second end of said tray bottom;

a first foot bar attached to an underside of said tray bottom, said first foot bar being vertically aligned with said first positioning rack; and a second foot bar attached to an underside of said tray bottom, said second foot bar being vertically aligned with said second positioning rack, wherein each of said first positioning rack and second positioning rack is perpendicular to said tray bottom and further comprises a plurality of apertures therethrough, each aperture having an upwardly opening slot.

9. The tray according to claim 8, wherein said doors outwardly moveable from said tray bottom between an open position and a closed position.

10. The tray according to claim 8, wherein said doors are removable.

11. The tray according to claim 8, said tray further comprising a center retaining piece affixed between said first positioning rack and said second positioning rack.

12. The tray according to claim 11, said tray further comprising a guide track mounted on an inner surface of said side walls with said center retaining piece being vertically moveable in said guide track.

13. The tray according to claim 8, wherein said first foot bar and said second foot bar further comprise a seating surface, said seating surface sized and configured so that said seating surface is capable of landing on a top surface of positioning racks of another cable tray in a stacked configuration.

14. The tray according to claim 13, said tray further comprising handles mounted on an outer surface of said side walls.

* * * * *